(12) United States Patent
Leschkies et al.

(10) Patent No.: US 9,935,005 B2
(45) Date of Patent: Apr. 3, 2018

(54) TECHNIQUES FOR FILLING A STRUCTURE USING SELECTIVE SURFACE MODIFICATION

(71) Applicant: Applied Materials, Inc., Santa Clara, CA (US)

(72) Inventors: Kurtis Leschkies, San Jose, CA (US); Steven Verhaverbeke, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/347,948

(22) Filed: Nov. 10, 2016

(65) Prior Publication Data

US 2017/0140983 A1   May 18, 2017

Related U.S. Application Data

(60) Provisional application No. 62/255,017, filed on Nov. 13, 2015.

(51) Int. Cl.
| | | |
|---|---|---|
| *H01L 21/31* | (2006.01) | |
| *H01L 29/06* | (2006.01) | |
| *H01L 21/30* | (2006.01) | |
| *H01L 21/768* | (2006.01) | |
| *C23C 16/455* | (2006.01) | |
| *C23C 16/48* | (2006.01) | |
| *C23C 16/50* | (2006.01) | |
| *C23C 16/52* | (2006.01) | |
| *C23C 16/56* | (2006.01) | |
| *H01L 21/67* | (2006.01) | |
| *C23C 16/02* | (2006.01) | |
| *C23C 16/04* | (2006.01) | |

(52) U.S. Cl.
CPC ........ *H01L 21/76879* (2013.01); *C23C 16/02* (2013.01); *C23C 16/045* (2013.01); *C23C 16/45527* (2013.01); *C23C 16/45536* (2013.01); *C23C 16/45544* (2013.01); *C23C 16/482* (2013.01); *C23C 16/50* (2013.01); *C23C 16/52* (2013.01); *C23C 16/56* (2013.01); *H01L 21/67075* (2013.01); *H01L 21/76802* (2013.01); *H01L 21/76883* (2013.01)

(58) Field of Classification Search
CPC .......... H01L 21/0228; H01L 21/02164; H01L 21/76224; H01L 21/02274; H01L 21/76844; H01L 21/02315; H01L 21/2855; H01L 21/31116
See application file for complete search history.

(56) References Cited

U.S. PATENT DOCUMENTS

| | | | | |
|---|---|---|---|---|
| 6,391,785 B1 * | 5/2002 | Satta | ................ | H01L 23/53252 257/E21.171 |
| 7,625,820 B1 * | 12/2009 | Papasouliotis | ........ | C23C 14/046 257/E21.553 |

(Continued)

*Primary Examiner* — Bradley K Smith
*Assistant Examiner* — David Goodwin

(57) ABSTRACT

A method of device processing. The method may include providing a cavity in a layer, directing energetic flux to a bottom surface of the cavity, performing an exposure of the cavity to a moisture-containing ambient, and introducing a fill material in the cavity using an atomic layer deposition (ALD) process, wherein the fill material is selectively deposited on the bottom surface of the cavity with respect to a sidewall of the cavity.

12 Claims, 7 Drawing Sheets

(56) References Cited

U.S. PATENT DOCUMENTS

| | | | | |
|---|---|---|---|---|
| 7,842,605 | B1 * | 11/2010 | Pradhan | C23C 14/046 257/E21.582 |
| 7,981,763 | B1 * | 7/2011 | van Schravendijk | H01L 21/02274 257/E21.546 |
| 2005/0074968 | A1 * | 4/2005 | Chen | H01L 21/2855 438/643 |
| 2008/0132057 | A1 * | 6/2008 | Feustel | H01L 21/76844 438/627 |
| 2008/0242097 | A1 * | 10/2008 | Boescke | C30B 25/04 438/703 |
| 2013/0164942 | A1 * | 6/2013 | Kato | H01L 21/30 438/758 |
| 2014/0141534 | A1 * | 5/2014 | Phatak | B01J 19/0046 438/5 |
| 2016/0343580 | A1 * | 11/2016 | Hudson | H01J 37/32513 |

\* cited by examiner

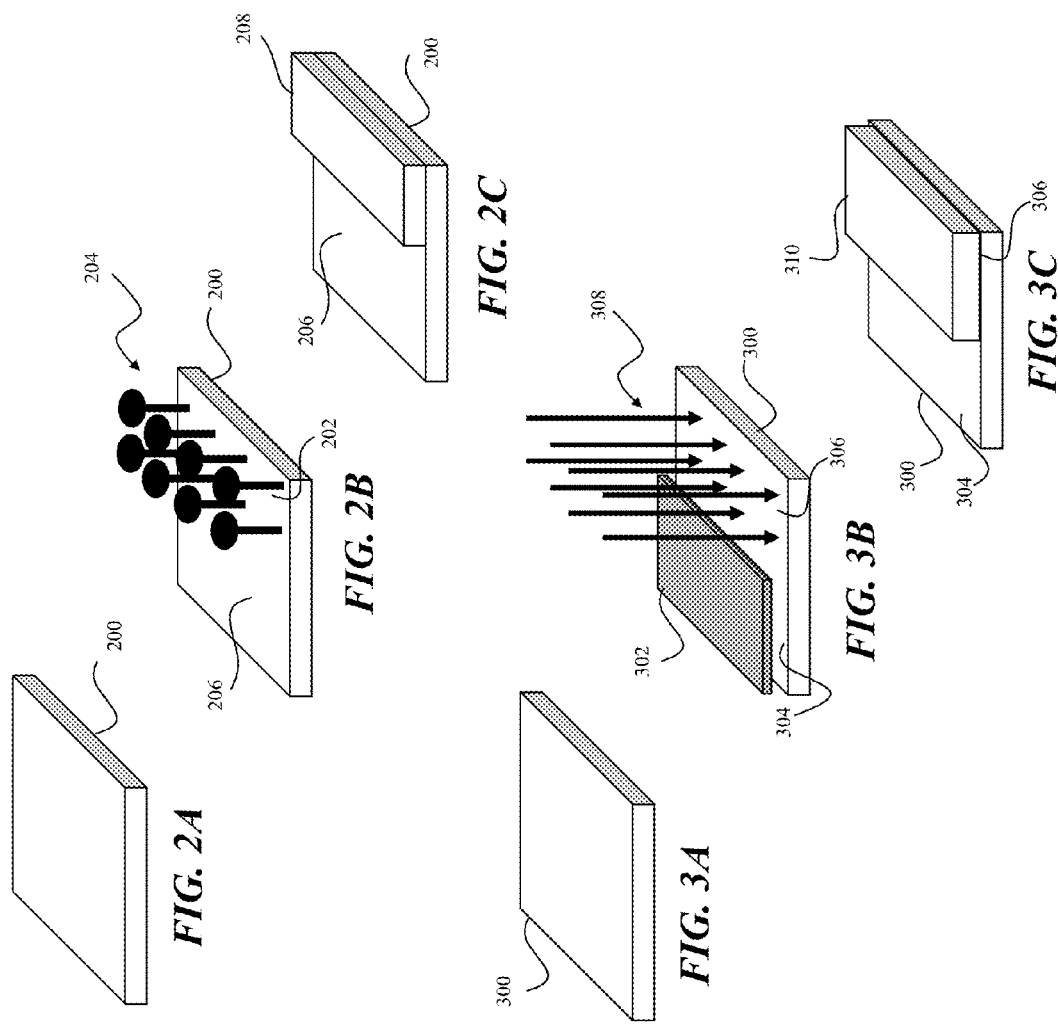

TECHNIQUES FOR FILLING A STRUCTURE USING SELECTIVE SURFACE MODIFICATION

RELATED APPLICATIONS

This application claims priority to U.S. Provisional Patent Application No. 62/255,017, filed Nov. 13, 2015, entitled TECHNIQUES FOR FILLING A STRUCTURE USING SELECTIVE SURFACE MODIFICATION, and incorporated by reference herein in its entirety.

FIELD

The present embodiments relate to processing device structures, and more particularly, to filling cavities in a device structure.

BACKGROUND

In the present day, device fabrication such as semiconductor device fabrication may entail filling of small cavities such as trenches, holes, or other structures. Such cavities may be filled with metal material, insulator material, or other material. As the dimensions of such cavities scale to smaller sizes, the ability to fill a cavity becomes more challenging. For example, filling of trench or via structures may be especially difficult when the aspect ratio (depth/width) of a given structure is high. In some examples, a trench may have an aspect ratio greater than one, in particular, greater than two. In various known deposition techniques to fill a trench, when filling material is introduced into the trench, the deposition of the filling material may take place on multiple exposed surfaces, including the bottom of the trench as well as trench sidewalls. This type of deposition may result in overhang and the formation of buried holes within the trench, leading to undesirable properties of a resulting device structure.

With respect to these and other considerations the present disclosure is provided.

BRIEF SUMMARY

In one embodiment, a method of device processing may include providing a cavity in a layer, directing energetic flux to a bottom surface of the cavity, performing an exposure of the cavity to a moisture-containing ambient, and introducing a fill material in the cavity using an atomic layer deposition (ALD) process. The fill material may be selectively deposited on the bottom surface of the cavity with respect to a sidewall of the cavity.

In another embodiment, a system may include a transfer chamber, where the transfer chamber is arranged to transport a substrate between a plurality of locations. The system may include an energetic flux chamber, where the energetic flux chamber is coupled to the transfer chamber to receive the substrate, where the energetic flux chamber directs energetic flux in a directional fashion to the substrate. The system may further include a moisture chamber, the moisture chamber being coupled to the transfer chamber and providing an $H_2O$ ambient to the substrate. The system may also include an atomic layer deposition chamber, the atomic layer deposition chamber being coupled to the transfer chamber and providing a first reactant and a second reactant to the substrate, the first reactant and the second reactant forming at least one monolayer of a fill material. The system may include an etch chamber, the etch chamber being coupled to the transfer chamber and directing an etchant to the substrate for etching the fill material.

In a further embodiment, a processing apparatus may include a process chamber to house a substrate; an energetic flux source, the energetic flux source providing energetic flux to the substrate in a directional manner; and a moisture source, the moisture source providing $H_2O$ to the substrate; and an atomic layer deposition source. The atomic layer deposition source may provide at least two species to the substrate for depositing a fill material on the substrate using an atomic layer deposition process. The energetic flux source, the moisture source, and the atomic layer deposition source may be coupled to the process chamber.

BRIEF DESCRIPTION OF THE DRAWINGS

FIGS. 2A to 2C depict exemplary operations according to other embodiments of the disclosure;

FIGS. 3A to 3C depict exemplary operations according to additional embodiments of the disclosure;

Figure 1B:
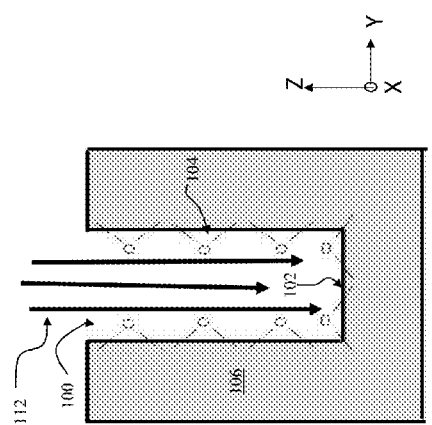
FIGS. 1A to 1D illustrate exemplary operations involved in a method according to embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The embodiments described herein provide novel device processing including processing for filling a cavity, such as a trench or via in a substrate. In various embodiments, techniques are provided for improving trench-fill or via-fill for cavities including high aspect ratio cavities where the aspect ratio is greater than 1. The embodiments are not limited in this context.

FIG. 1A to FIG. 1D illustrate exemplary operations involved in a method for filling a cavity according to embodiments of the disclosure. The cavity may be provided in a structure such as a substrate base or a layer disposed on a substrate base in various embodiments. A substrate base may, for example, be a material such as a semiconductor, insulator, or other material forming the major part of a substrate. Any number of layers may be disposed on the substrate base.

Figure 1D:
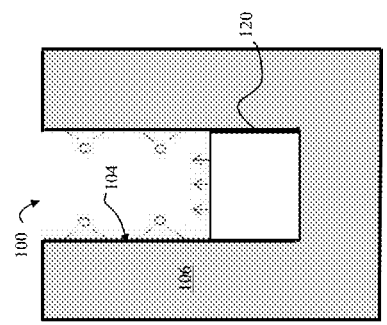
Figure 1A:
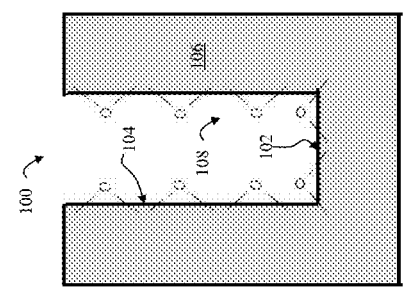

Turning now to FIG. 1A, there is shown a cavity 100 arranged within a structure, shown as layer 106. In various embodiments, the layer 106 may represent a substrate base or may be a layer arranged within or on a substrate (not shown). In some embodiments, the layer 106 may be composed of silicon oxide, silicon nitride, or silicon oxycarbide. The embodiments are not limited in this context.

The cavity 100 may have different structure according to various embodiments of the disclosure. In some embodiments, the cavity 100 may have a via structure where the cavity has an oval or circular shape within an X-Y plane according to the Cartesian coordinate system shown. In these embodiments, the sidewall 104 may be just one sidewall defining the side of the cavity 100. In other embodiments, the cavity has a trench structure where the trench includes a pair of opposing sidewalls, shown as the sidewall 104. Additionally, such a trench may include opposing endwalls (not shown). The cavity 100 may also include a bottom surface 102, as shown. In some embodiments, the cavity may have a complex shape within the X-Y plane, such as any targeted trench pattern to be filled.

According to various embodiments, the sidewalls and bottom surface of the cavity 100 may be terminated by surface species 108, such as oxygen. As detailed below, the surface species 108, disposed on the surface of the cavity 100, may be configured to react with certain reactive species provided in a deposition process to facilitate deposition of a target material such as an insulator or metal.

Turning now to FIG. 1B, there is shown an operation where energetic flux 112 is directed to the bottom surface 102 of the cavity 100. In various embodiments, the energetic flux 112 may be provided in an energetic flux chamber, where the energetic flux 112 may be ions, electrons, or photons, or a combination thereof. The energetic flux 112 may be provided in a directional fashion to the bottom surface 102 of cavity 100 where the bottom surface 102 is impacted preferentially in comparison to the sidewalls 104. In embodiments where ions constitute the energetic flux 112, the ions may be directed in a collimated fashion toward the bottom surface 102. In particular embodiments, the ions may be directed as an ion beam containing ions having parallel trajectories. The ions may be provided to have trajectories parallel to the sidewalls 104, for example. In cases where the sidewalls 104 on opposite sides of a trench are generally disposed parallel to one another, a parallel beam of ions may be directed parallel to the sidewalls 104 so as to strike the bottom surface 102 and not to strike the sidewalls 104. In this manner, the ions or other energetic flux may selectively alter the bottom surface 102 while not altering the sidewalls 104. According to some embodiments, in the operation of FIG. 1B energetic ions may be provided using a known beamline ion implanter, compact ion beam source, plasma source, or other known source capable of providing collimated ions.

In accordance with various embodiments, the energy of the energetic flux may be arranged to provide adequate energy to alter the surfaces of cavity 100 exposed to the energetic flux, in a manner rendering the surfaces more susceptible to formation of hydroxide (OH) terminations. In embodiments using ions to alter the surface of a cavity, the ion energy of ions may be tailored to provide adequate energy to render impacted surface(s) susceptible to hydroxide formation, while not imparting excessive damage to the impacted surface(s). In some embodiments, the ion energy of ions provided as energetic flux 112 may range between 5 eV and 500 eV. In some embodiments, ions may be provided as inert gas ions including Ar ions, or may be reactive ions, including $O_2$ ions. In embodiments where photons are used as energetic flux 112, the photons may be provided as ultraviolet phonons in the ultraviolet (UV) energy range or vacuum ultraviolet photons in the vacuum ultraviolet (VUV) energy range. In particular embodiments, the photon energy of photons used as energetic flux 112 may be in the range of 7 eV to 10 eV.

Figure 1C:
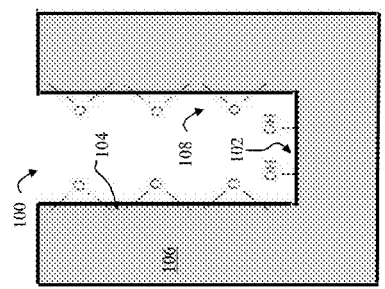

In accordance with embodiments of the disclosure, the cavity 100 may be exposed to a moisture-containing ($H_2O$) ambient in conjunction with exposure to the energetic flux 112. In various embodiments, the moisture-containing ambient may be provided subsequently to the providing of the energetic flux 112. Turning now to FIG. 1C there is shown a scenario of the cavity 100 after exposure to energetic flux 112 and after exposure to moisture-containing ambient. In this example the energetic flux 112 has been selectively directed to the bottom surface 102 while not impacting the sidewalls 104, as suggested by FIG. 1B. As illustrated, the bottom surface 102 may now be terminated by OH groups, while the sidewalls 104 are not terminated by OH groups. This difference may result as a consequence of alteration of the trench bottoms using the energetic flux 112 in conjunction with $H_2O$. While the sidewalls 104 are exposed to $H_2O$ during the exposure of the cavity to moisture-containing ambient, the sidewalls 104, being unaltered by energetic flux 112, may not react with $H_2O$ to form an OH reaction product on their surface.

After selective formation of an OH-terminated surface at the bottom surface 102, according to embodiments of the disclosure, the cavity 100 may be exposed to a deposition process, such as atomic layer deposition (ALD). ALD generally involves sequential exposure to two or more reactants to deposit a given monolayer of material. In various embodiments, an ALD process may be performed to selectively deposit a material such as an oxide, nitride or metal, such as Ta. In some embodiments, the oxide may be a high dielectric constant material, where examples of high dielectric constant materials include $Al_2O_3$, $HfO_2$, $Ta_2O_5$, and other materials where the dielectric constant is greater than the dielectric constant of $SiO_2$. The embodiments are not limited in this context.

In accordance with embodiments of the disclosure, deposition of the fill material using an ALD process may be selectively promoted on the bottom surface 102 with respect to the sidewalls 104. In particular, the OH-termination of the bottom surface 102 may promote deposition of an aluminum-containing reactant, hafnium-containing reactant, or tantalum-containing reactant, to name certain materials. In different examples, this OH-termination may accordingly result in selective growth of $Al_2O_3$, $HfO_2$, $Ta_2O_5$, or tantalum metal on the bottom surface 102, as opposed to the sidewalls 104. In various embodiments, the given ALD process may be performed in a cyclic fashion to generate bottom-up filling of a given material as suggested by the fill material 120 shown in FIG. 1D. In other words, growth from sidewalls 104 generally may be suppressed while growth of layers parallel to the bottom surface 102 is enhanced. This growth may help avoid pinch-off, even for high-aspect ratio trenches or vias.

By way of further explanation, FIG. 2A to FIG. 2C illustrate a sequence for selective ALD in accordance with the present embodiments. While illustrated for a planar substrate configuration, the process of FIGS. 2A to 2C may be employed in the aforementioned sequence shown in FIGS. 1A to 1C. In FIG. 2A, a dielectric substrate 200 is provided. The dielectric substrate 200 may represent the surfaces of cavity 100 in some examples. In other words, the planar surface of the dielectric substrate 200 may present the same material as surfaces of the cavity 100. In FIG. 2B, a portion 202 of the dielectric substrate 200 is selectively altered so as to generate functional groups 204 on the portion 202, while not generating functional groups 204 on the portion 206. In this manner, selective ALD may be promoted on the portion 202, where the ALD process is enhanced by the presence of the functional groups 204. As shown in FIG. 2C, a layer 208 may subsequently be deposited on the portion 202 by ALD, while no layer grows on the portion 206.

Turning now to FIG. 3A to FIG. 3C, there is shown a specific implementation of the process of FIGS. 2A to 2C according to an embodiment of the disclosure. In this example, at FIG. 3A a silicon oxycarbide substrate 300, such as BDIIx, is provided. In FIG. 3B, a mask 302 is provided to mask a portion 304 of the silicon oxycarbide substrate 300. At the same time, energetic flux 308 is directed to an unmasked portion 306 of the silicon oxycarbide substrate 300. In various embodiments, an energetic flux chamber generating the energetic flux 308 may be an ultraviolet chamber, where the ultraviolet chamber comprises an ultraviolet radiation source. In some embodiments, the ultraviolet radiation source may emit radiation having a wavelength between 150 nm and 200 nm, for example. In this particular example, the energetic flux may constitute 172 nm ultraviolet radiation (NBUV). Before exposure to an $HfO_2$ ALD process, the portion 304 and portion 306 are also exposed to a moisture-containing ambient. As a result, selective growth of an $HfO_2$ layer 310 takes place by exposing the entirety of the silicon oxycarbide substrate 300 to a subsequent ALD process. As shown, the $HfO_2$ layer 310 grows just on the unmasked portion 306 and not on the portion 304.

Figure 4:
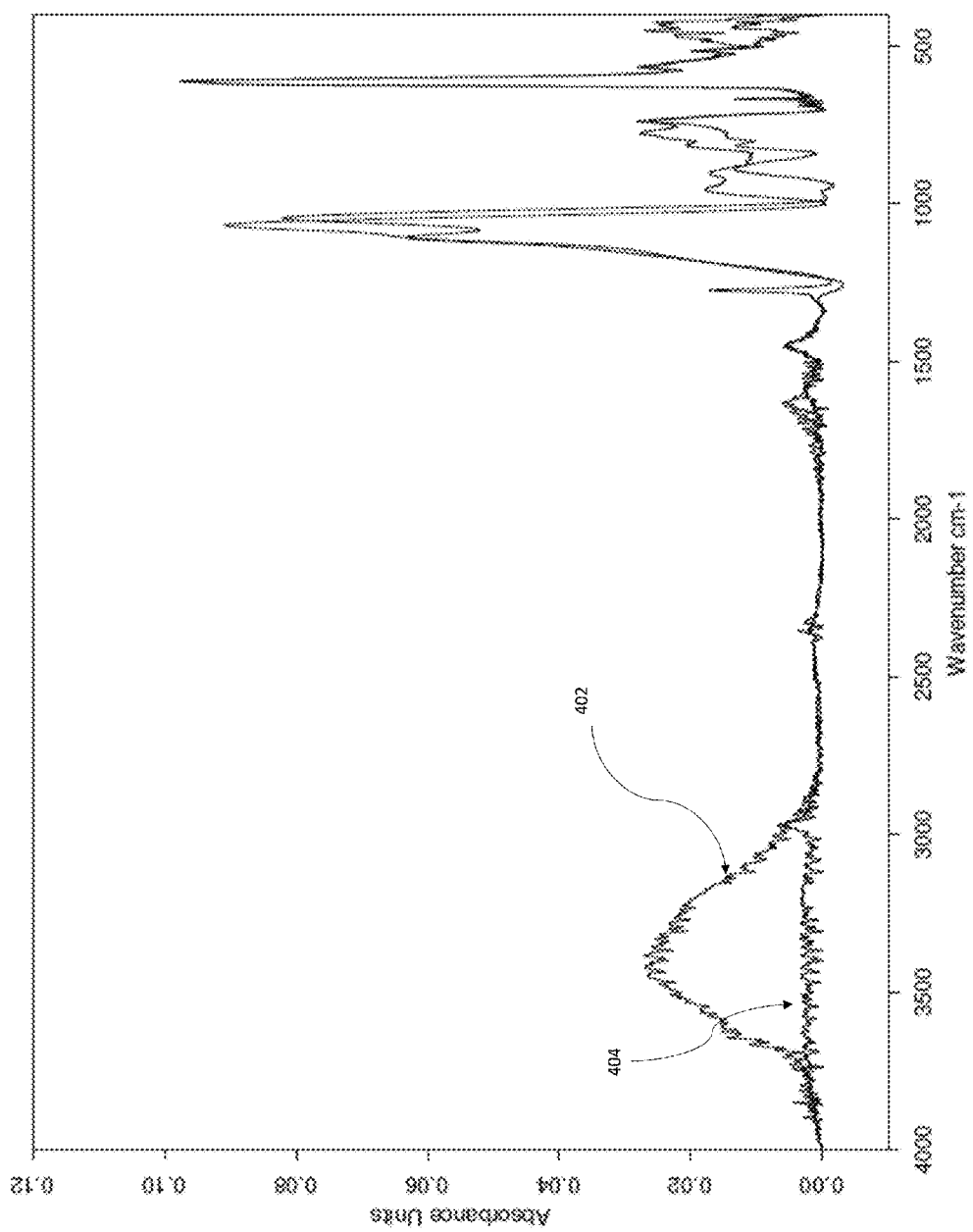
FIG. 4 illustrates Fourier transform Infrared spectra comparing results of film growth on a substrate with and without exposure to energetic flux before an atomic layer deposition process.

FIG. 4 illustrates Fourier transform Infrared spectra comparing results of film growth on the silicon oxycarbide substrate 300 in regions with and without exposure to energetic flux before an ALD process is performed. As shown, the spectrum 402, taken in the unmasked portion 306, shows an absorption peak in the range of 3400 wavenumbers, characteristic of film formation. The spectrum 404, taken in the portion 304, shows no peak indicative of film formation.

Figure 5:
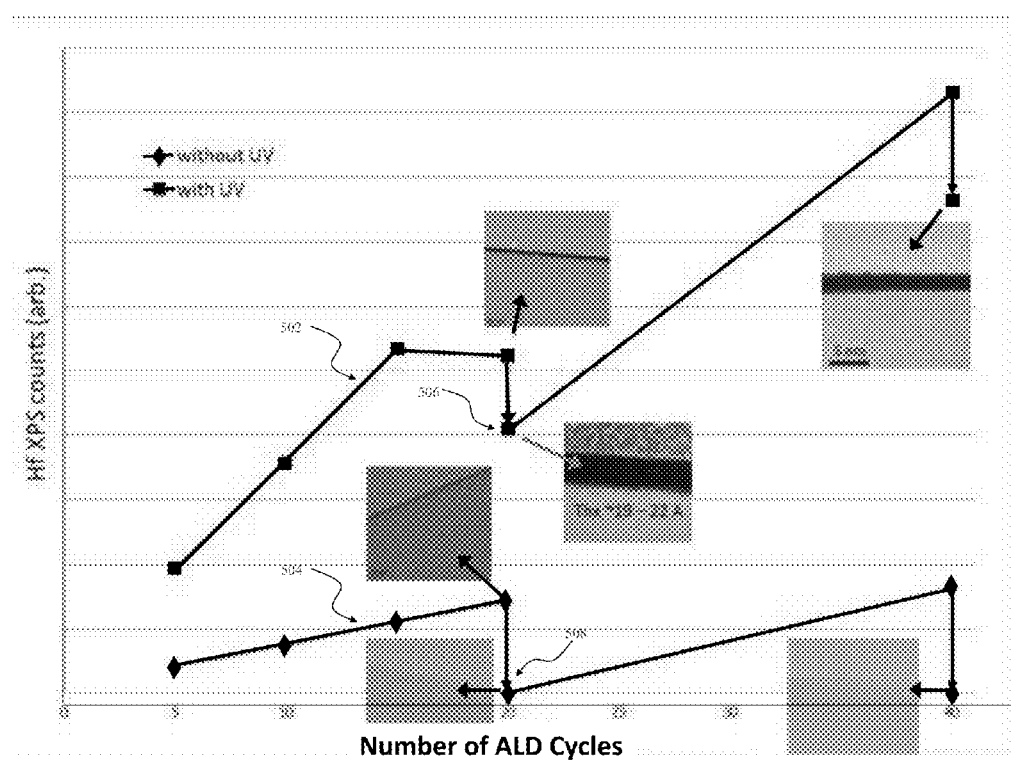
FIG. 5 is a composite diagram illustrating a comparison of film growth on a substrate using an atomic layer deposition process, with and without exposure to energetic flux before performing the atomic layer deposition.

In accordance with additional embodiments of the disclosure, selective deposition of a given material on a targeted surface may be promoted by performing a combination of ALD and etching. In some embodiments, the ALD and etching, such as HF etching, may be performed in a cyclic fashion. The embodiments are not limited in this context. FIG. 5 is a composite diagram illustrating a comparison of film growth on a substrate using an atomic layer deposition process, comparing regions of a substrate with and without exposure to UV photon flux before performing the atomic layer deposition. In particular, an example of selective ALD deposition of $HfO_2$ on silicon oxycarbide is shown. The graph of FIG. 5 illustrates the amount of hafnium oxide deposited on a substrate sample as a function of the number of ALD cycles performed. The amount of hafnium oxide is indicated by the intensity of an X-ray photoelectron spectroscopy (XPS) signal used to measure a given sample. The curve 502 represents the amount of hafnium oxide deposited on a substrate portion exposed to UV flux and moisture before ALD, shown as a function of the number of ALD cycles. The curve 504 represents hafnium oxide deposited on a substrate portion exposed to moisture while not exposed to UV flux before ALD. In this experiment, an initial series of 20 ALD cycles is performed before an etching process is performed. As illustrated, the amount of hafnium oxide increases with number of ALD cycles in the two cases, while the rate of deposition in the UV-exposed substrate portion is perhaps three to four times the rate of deposition in the unexposed substrate portion.

After 20 ALD cycles, the exposed region subject to UV flux and unexposed region of the substrate are subject to an etch, where the etch removes a target amount of hafnium oxide material. The respective amount of hafnium oxide remaining after etch in the two samples is illustrated by the point 506 and point 508. As shown, no hafnium oxide remains on the unexposed portion after etch, while a hafnium oxide layer remains on the exposed portion. Subsequently, a series of 20 more ALD cycles is performed, followed by a second etch. At the end of this process, no hafnium oxide remains on the unexposed portion, while hafnium oxide remains on the exposed portion. This result is confirmed by the inset figures, showing cross-sectional electron micrographs of UV-exposed samples and unexposed samples at various stages of processing. As illustrated in the upper right inset figure, approximately 3 nm hafnium oxide layer is deposited after 40 ALD cycles in this example.

The above example of FIG. 5, performed on planar substrates, is exemplary and may be applied to enhance bottom-up trench-fill or via-fill process. For example, bottom-up fill of a cavity may be enhanced by performing selective exposure of a bottom surface to energetic flux, in conjunction with exposure to moisture, subsequent ALD of fill material into the cavity, and etching of fill material after the ALD process. In this manner, any unwanted deposition on a sidewall of a trench occurring after a sequence of ALD may be removed. This removal may facilitate an improved bottom-up trench-fill process, avoiding the type of growth causing void formation or other unwanted microstructure.

For example, for purposes of illustration, in one scenario after 20 ALD cycles is performed a 4 nm thick layer of fill material may be deposited in a trench, generally in a bottom-up manner, as shown in FIG. 1D. Subsequently, an etch may be performed for removing 0.5 nm of fill material. This etch may be effective to remove any residual fill material from sidewalls exposed above the surface of the fill material in the trench. Said differently, no fill material may be present on exposed regions of the sidewalls above a surface of the fill material after the etch process. The etch may also recess the fill material by 0.5 nm. Subsequently, an additional ALD process may be performed to continue the bottom-up trench-fill process. This sequence may be repeated as needed until a trench is completely filled or filled to a target level.

Figure 6:
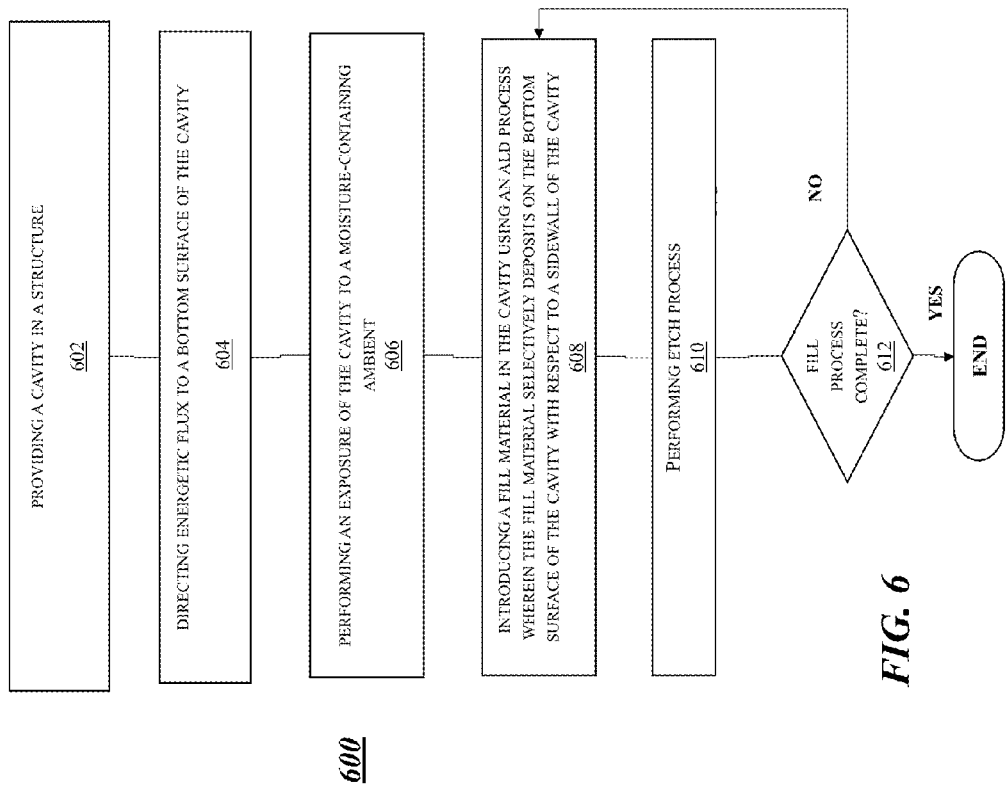
FIG. 6 presents an exemplary process flow according to embodiments of the disclosure.

FIG. 6 presents an exemplary process flow 600 according to embodiments of the disclosure. At block 602, the operation is performed of providing a cavity in a layer. At block 604, energetic flux is directed to a bottom surface of the cavity. In various embodiments, the energetic ion flux may include ions having a target ion energy, such as an ion energy of 500 eV or less.

At block 606, an exposure of the cavity to a moisture-containing ambient is performed. According to various embodiments, the exposure to moisture-containing ambient may be conducted after block 604.

At block 608, a fill material is introduced in the cavity using an ALD process, wherein a fill material is selectively deposited on the bottom surface of the cavity with respect to a sidewall of the cavity. In various embodiments, the fill material may constitute an oxide such as a high dielectric constant material, or a metal.

At block 610, an etch process is performed. The etch process may be arranged to remove a predetermined amount of fill material. At decision block 612, a determination is made as to whether the fill process is complete. If so, the flow ends. If not, the flow returns to block 608.

Figure 7:
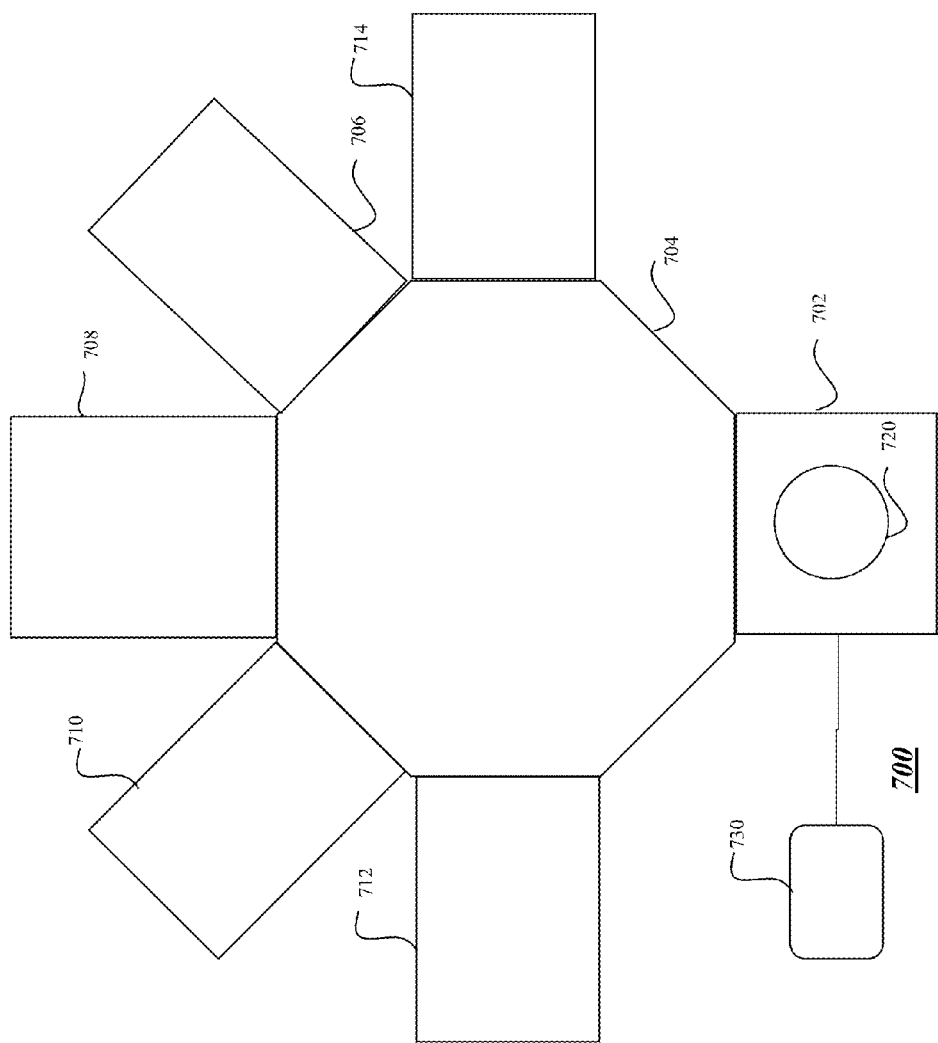
FIG. 7 presents an exemplary system according to embodiments of the disclosure.

FIG. 7 presents a top plan view (X-Y plane) of an exemplary system, shown as system 700, according to embodiments of the disclosure. The system 700 may be used for performing the fill processes in accordance with the embodiments disclosed herein. The system 700 may be configured as a cluster tool, including a loadlock 702 and transfer chamber 704 to transport a substrate 720 to and between various processing chambers. The transfer chamber 704 and processing chambers may be coupled to evacuation apparatus such as known pumping systems (not shown) for maintaining the transfer chamber 704 and other processing chambers, discussed below, under vacuum conditions, or under controlled ambient conditions. Accordingly, the substrate 720 may be transported between the various processing chambers and transfer chamber 704 without exposure to ambient. The system 700 may include a plasma immersion chamber 706, coupled to the transfer chamber 704, where the substrate 720 is exposed to ions directed in a parallel fashion into cavities in the substrate 720. The system 700 may further include a moisture chamber 708, coupled to the transfer chamber 704, and providing a controlled exposure to $H_2O$. The system 700 may also include an atomic layer deposition chamber, shown as ALD chamber 710, coupled to the transfer chamber 704, and arranged according to known apparatus to expose the substrate 720 to an atomic layer deposition process for a given material system, such as $Al_2O_3$, $HfO_2$, $Ta_2O_5$, or tantalum metal, for example. The ALD chamber 710 may, for example, be coupled to two or more sources of vapor species to be controllably directed into the ALD chamber 710 to perform an atomic layer deposition process. The system 700 may also include an etch chamber 712, coupled to the transfer chamber 704, where the substrate 720 may be exposed within the etch chamber 712 to an etchant such as HF or other etchant for removing a predetermined amount of material during filling of a cavity. The system 700 may additionally include a UV chamber 714, coupled to the transfer chamber 704, and directing ultraviolet radiation at a predetermined wavelength range to the substrate 720. For example, instead of processing a substrate 720 in the plasma immersion chamber 706, the substrate 720 may be transferred into the UV chamber 714, where ultraviolet radiation may be directed in a controlled fashion to the bottom of a cavity in the substrate 720, as generally depicted in FIG. 1B. The substrates 720 may accordingly be transferred between the various process chambers of the system 700 without being exposed to outside ambient. In particular embodiments, the UV chamber 714 may include energetic lamps producing radiation with peak energy in the range of 172 nm, and an energy range between approximately 7 eV to 10 eV.

The system 700 may further include a controller 730 to direct and coordinate transport and processing of a substrate 720, among the different processing chambers of system 700. For example, the controller 730 may include any combination of software and hardware, including logic, memory, and a user interface, to control processing of a substrate among a plurality of processing chambers of the system 700, including plasma immersion chamber 706, moisture chamber 708, ALD chamber 710, and etch chamber 712. As one example, the controller 730 may direct the substrate 720 to be transferred between various process chambers of system 700 in a cyclic process according to a recipe for filling a cavity. A cyclic process may entail transferring the substrate 720 multiple times into and out of a given processing chamber(s), and may entail transferring the substrate 720 between different processing chambers multiple times to complete a cavity fill process. In one specific example of a processing recipe, the substrate 720 may be transported into the UV chamber 714 for a first exposure to energetic photons to alter a bottom surface of cavities within the substrate 720. The substrate 720 may subsequently be transported via transfer chamber 704 to moisture chamber 708 for a second exposure, where the bottom surface of cavities becomes OH-terminated, as described above with respect to FIG. 1C. Subsequently, the substrate 720 may be transported to the ALD chamber 710 for an initial ALD processing sequence, where the substrate 720 is exposed to a first number of ALD cycles. The first number of ALD cycles may be a predetermined number of ALD cycles arranged to deposit a fill material to a predetermined thickness in the cavities. After the initial ALD processing sequence, the substrate 720 may be transported to the etch chamber 712 to etch the fill material to a predetermined amount. This etch of the fill material may result in the fill material being removed entirely from unwanted surfaces not directly exposed to UV radiation, where the growth rate of fill material may be much less, as discussed above with respect to FIG. 5. The substrate 720 may then be transferred back to the ALD chamber 710 for an additional number of ALD cycles. For example, a second ALD processing sequence may be performed, where the substrate 720 is exposed to a second number of ALD cycles to increase the thickness of fill material in the cavities. This second ALD processing sequence may be followed by transferring the substrate 720 back to the etch chamber 712, for a second etch process. The cycling between ALD chamber 710 and etch chamber 712 may be performed according to a predetermined recipe to optimize bottom up filling of a cavity. In the entirety of the processing of the substrate 720, after entering loadlock 702, the substrate 720 may be processed without exposure to ambient outside the system 700.

Figure 8:
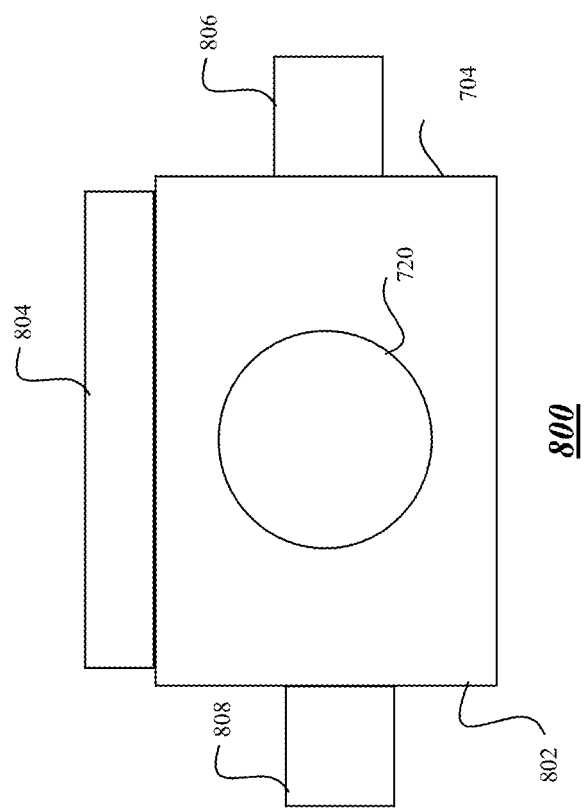
FIG. 8 presents an exemplary apparatus according to embodiments of the disclosure.

While system 700 may provide one approach involving a cluster tool configuration for performing a cavity fill process in accordance with embodiments of the disclosure, in other embodiments, cavity fill processes may be performed using different apparatus. For example, in some embodiments, a processing apparatus for performing a cavity fill process may include fewer process chambers, such as just one process chamber. In one embodiment, as shown in FIG. 8, an apparatus 800 may include a process chamber 802 to house a substrate, such as the substrate 720. The apparatus 800 may further include an energetic flux source 804 providing energetic flux to the substrate in a directional manner, as well as a moisture source 806, where the moisture source 806 provides H₂O to the substrate 720. The apparatus 800 may also include an atomic layer deposition source 808, where the atomic layer deposition source 808 provides at least two species to the substrate for depositing a fill material on the substrate 720 using an atomic layer deposition process. The atomic layer deposition source, in particular, may include multiple gas sources or vapor sources, where a given gas source or vapor source provides one component of an ALD process. In some examples, the energetic flux source 804, moisture source 806, and atomic layer deposition source 808, may all be coupled to the process chamber 802 for the different processing to be performed therein.

The present embodiments provide the advantage of filling narrow trenches and trenches having high aspect ratio without buried voids by favoring growth just on a target surface, such as the bottom of a trench. In addition, the present embodiments provide a further advantage scalability to smaller dimensions, since cavities such as trenches may be filled from the bottom up.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method of device processing, comprising:
   providing a cavity in a layer;
   directing energetic flux to a bottom surface of the cavity;
   performing an exposure of the cavity to a moisture-containing ambient; and
   introducing a fill material in the cavity using an atomic layer deposition (ALD) process, wherein the fill material is selectively deposited on the bottom surface of the cavity with respect to a sidewall of the cavity so as to completely fill the cavity, wherein the sidewall and the bottom surface comprise a same material, wherein the sidewall is oriented perpendicularly to the bottom surface, and wherein the energetic flux is oriented parallel to the sidewall and does not strike the sidewall of the cavity.

2. The method of claim 1, wherein the energetic flux comprises ions, the ions having parallel trajectories.

3. The method of claim 2, wherein the ions comprise trajectories oriented parallel to the sidewall of the cavity.

4. The method of claim 2, wherein the ions comprise an ion energy of 500 eV or less.

5. The method of claim 1, wherein the bottom surface forms an OH-terminated surface after the exposure, and wherein the sidewall does not form an OH-terminated surface after the exposure.

6. The method of claim 1, wherein the fill material is a high dielectric constant material.

7. The method of claim 1, wherein the fill material is a metal.

8. The method of claim 1, wherein the cavity is disposed in a material comprising silicon oxide, silicon nitride, or silicon oxycarbide.

9. The method of claim 1, wherein the energetic flux comprises vacuum ultraviolet photons or electrons.

10. The method of claim 1, wherein the ALD process is performed for a predetermined number of ALD cycles, the method further comprising performing an etch process after the predetermined number of ALD cycles, the etch process being effective to remove a predetermined amount of fill material.

11. The method of claim 10, wherein no fill material is present on exposed regions of the sidewall above a surface of the fill material after the etch process.

12. The method of claim 10, further comprising performing a second ALD process comprising an additional number of ALD cycles after the etch process.

* * * * *